United States Patent [19]

Sheyman: Vladimir

[11] Patent Number: 4,880,053
[45] Date of Patent: Nov. 14, 1989

[54] TWO-PHASE COOLING APPARATUS FOR ELECTRONIC EQUIPMENT AND THE LIKE

[75] Inventor: Sheyman: Vladimir, W. Bloomfield, Mich.

[73] Assignee: The Board of Governors of Wayne State University, Detroit, Mich.

[21] Appl. No.: 341,903

[22] Filed: Apr. 24, 1989

[51] Int. Cl.$^4$ ............................................... F28D 15/02
[52] U.S. Cl. ................................ 165/104.26; 165/41; 165/104.33; 361/385
[58] Field of Search ...................... 165/104.26, 104.33, 165/41; 361/385

[56] References Cited

U.S. PATENT DOCUMENTS

| | | | |
|---|---|---|---|
| 3,489,207 | 1/1970 | Miller | 165/104.33 |
| 3,750,745 | 8/1973 | Moore, Jr. | 165/104.26 |
| 3,852,805 | 12/1974 | Brzozowski | 165/104.26 |
| 4,377,198 | 3/1983 | Welling et al. | 165/104.33 |

OTHER PUBLICATIONS

Connors et al., P.M., *Flat-Type Heat Pipes*, IBM Technical Disclosure Bulletin, vol. 18, No. 3, pp. 675–676, 8/1975.

Primary Examiner—Albert W. Davis, Jr.
Attorney, Agent, or Firm—Harness, Dickey & Pierce

[57] ABSTRACT

A two-phase cooling device includes a sealed enclosure defined by at least first and second, spaced thermally conductive walls interconnected by side walls. One of the thermally conductive walls is adapted for interconnection in a thermally conductive relationship with the item desired to be cooled. A wick structure is disposed within the generally hollow interior of the sealed enclosure, and includes a first wick portion extending along at least a portion of the thermally conductive wall adjacent the item to be cooled and at least one second wick portion protruding transversely from the first wick portion. The second wick portion is at least partially submerged within a thermally conductive liquid disposed within the hollow interior of the sealed enclosure. The thermally conductive liquid is capable of being transported through the wick portions, with the liquid being evaporated by the transfer of heat from the item to be cooled into the first wick portion. The vapor is then condensed on various surfaces such as those defined by internal components, as well as the surface of the thermally conductive liquid.

36 Claims, 3 Drawing Sheets

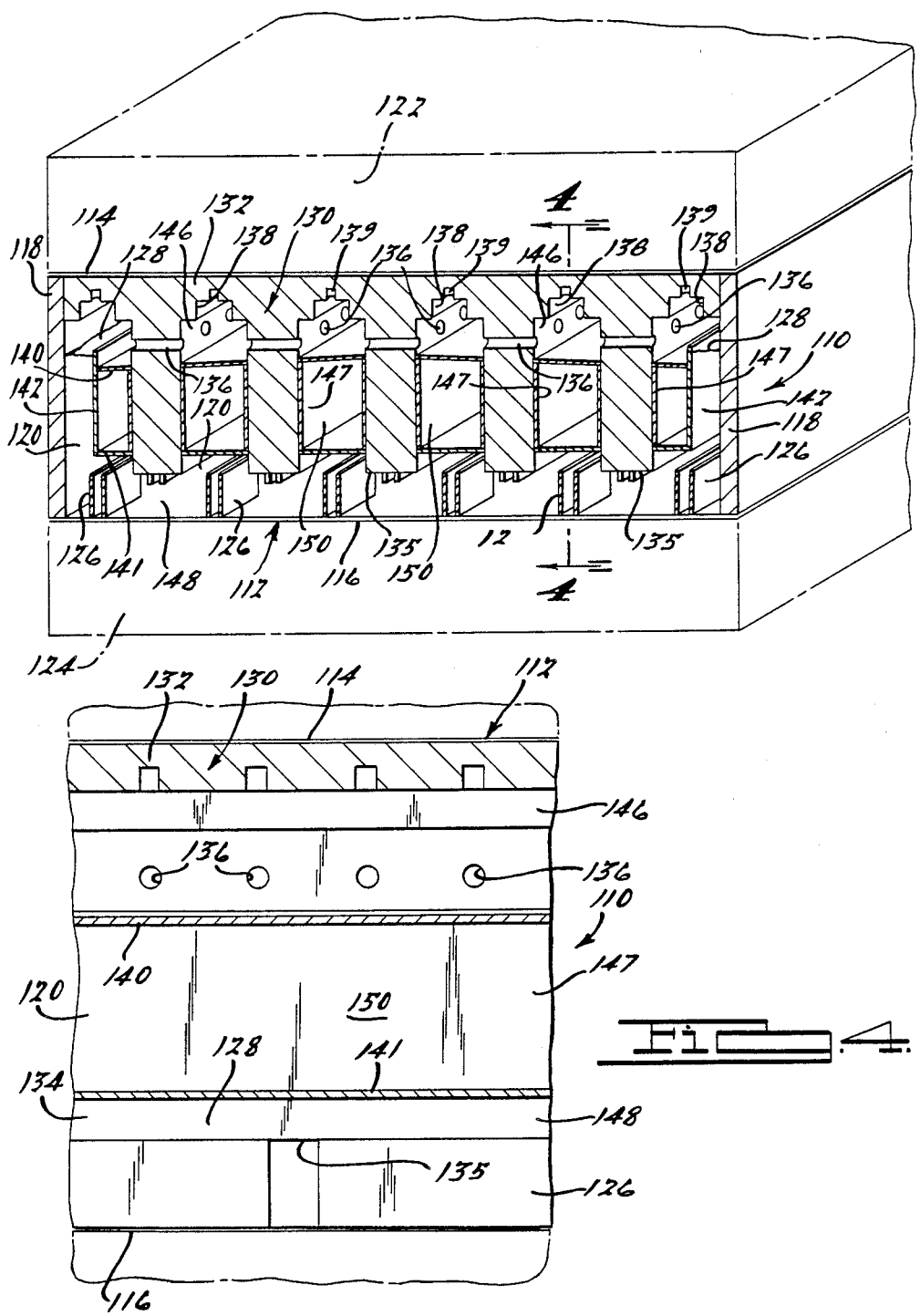

TWO-PHASE COOLING APPARATUS FOR ELECTRONIC EQUIPMENT AND THE LIKE

BACKGROUND AND SUMMARY OF THE INVENTION

The invention relates generally to cooling devices for transferring heat from an item to be cooled, such as electronic components, for example. More, specifically, the present invention relates to such devices wherein a phase change in a cooling medium, from the liquid to the gaseous phase, is employed to extract heat from the item to be cooled. Sufficient control of temperatures in components of a system is frequently very critical to the proper operation of the system, but is often difficult to achieve. Such temperature control is especially critical in electronic components that are subjected to severe environments, such as those frequently found in automotive electronic applications. Recent trends in automotive design have further complicated this problem in that electronic components are now being located closer to other system components, such as the engine or power train, in order to obtain various advantages in vehicle design, assembly, and servicing operations.

In order to address the temperature control problems discussed above, various systems have been proposed, but most of which which suffer from one or more disadvantages. For example, many of the components or systems used to attain the required degree of temperature control depend upon an external power source for their operation, are inordinately expensive or complex to manufacture, install, or service, or are not effective over widely varying ambient conditions. The present invention, however, seeks to overcome these disadvantages by providing a two-phase cooling apparatus capable of providing increased reliability, stable temperature control, an internal heat accumulation function, and no need for external power requirements.

According to the present invention, a two-phase cooling device for transferring heat from an item to be cooled includes a sealed enclosure defined by at least first and second thermally conductive walls spaced apart from one another and by side walls interconnecting the first and second thermally conductive walls. One of the thermally conductive walls is adapted for interconnection in a thermally conductive relationship with the item desired to be cooled.

A wick structure is disposed within the generally hollow interior of the sealed enclosure, and the wick structure includes a first wick portion extending along at least a substantial portion of the thermally conductive wall to which the item to be cooled is interconnected, as well as at least one second wick portion protruding transversely from the first wick portion. The second wick portion has a free end extending generally adjacent the second thermally conductive wall, with the second wick portion or portions being at least partially submerged within a thermally conductive liquid disposed within the hollow interior of the sealed enclosure.

The thermally conductive liquid (examples of which can be glycol, water, ammonia, acetone, methylalcohol, or a mixture thereof, or other suitable substances known to those skilled in the art), is capable of being transported through the wick portions, with the liquid being evaporated by the transfer of heat from the item to be cooled into the first wick portion. The vapor is then condensed on various surfaces such as those defined by internal components, as well as the surface of the thermally conductive liquid.

Preferably the two-phase cooling device also includes at least one partition extending through the interior of the enclosure to at least partially divide the interior into a heat intake chamber and a heat rejection chamber, with the partition having at least one partition opening extending therethrough in order to provide fluid communication between the heat intake and rejection chambers. In other embodiments, however, a pair of spaced-apart partitions are provided in order to define an intermediate chamber between the heat intake chamber and the heat rejection chamber. Such intermediate chamber, which is spaced apart from the side walls in order to provide the above-mentioned opening, can be evacuated or filled with a thermally conductive, high-boiling-point liquid in order to provide for an enhanced heat accumulation capability.

These and other objects, advantages, and features of the present invention will become apparent from the following description and appended claims, taken in conjunction with the accompanying drawings.

BRIEF DESCRIPTION OF THE DRAWINGS

FIG. 3 is a partial perspective view, similar to that of FIG. 1, but illustrating an alternate embodiment of the present invention, wherein an intermediate chamber is disposed between the heat intake and rejection chambers of the two-phase cooling device.

FIG. 4 is a cross-sectional view, taken generally along line 4—4 of FIG. 3.

DETAILED DESCRIPTION OF THE PREFERRED EMBODIMENTS

Figure 1:
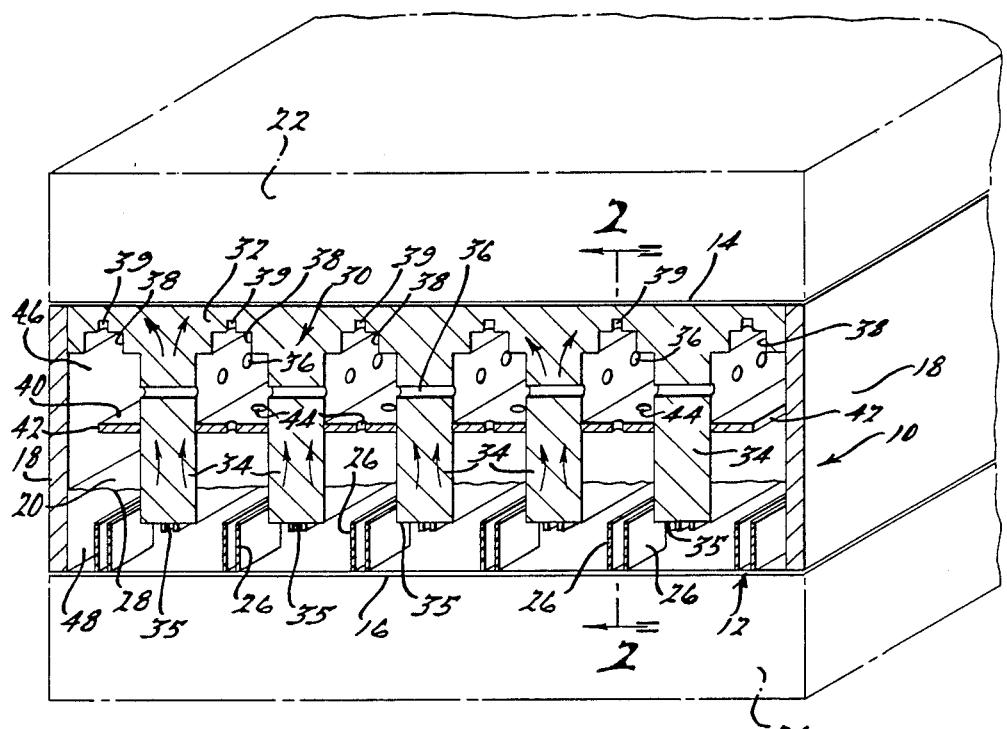
FIG. 1 is a partial perspective view, partially represented in cross-sectional form, diagrammatically illustrating a two-phase cooling device according to the present invention.

FIGS. 1 through 5 illustrate various embodiments of the present invention, as adapted for use in temperature control of an electronic device in an automotive or other such application. From the following discussion, however, one skilled in the art will readily recognize that the principles of the present invention are not limited to the application shown in the drawings merely for exemplary purposes, but rather applicable to a wide variety of applications requiring a reliable and relatively stable temperature control feature.

In FIG. 1, an exemplary, illustrative temperature control device 10 generally includes a hermetically sealed enclosure 12 made up of a first thermally conductive wall 14 spaced apart from a second thermally conductive wall 16, with the thermally walls 14 and 16 sealingly interconnected by side walls 18. The enclosure 12 thus defines a generally hollow interior 20, with the first thermally conductive wall 14 being interconnected in a heat transfer relationship with an item to be cooled, which is diagrammatically represented by reference numeral 22. Similarly, if necessary or desirable in a given application, the second thermally conductive wall 16 can be interconnected in a heat transfer relationship with a heat sink 24, which can be another component in the system, a structural frame member, or other item at a temperature lower than that of the temperature-controlled item 22. In order to aid in the rejection of heat from the enclosure 12, a number of preferably discrete and spaced apart cooling fins 26 can be disposed in an outwardly-protruding relationship with the second thermally conductive wall 16. It should be noted that such spacing of the preferred discrete fins 26 is advantageous in contributing to the mixing and resultant uniformity of temperature of the cooling liquid 26 discussed below.

It should be emphasized that the first and second thermally conductive walls should have high thermal conductivity factors in order to facilitate the transfer of thermal energy therethrough, while the side walls 18 can be thermally insulated if deemed desirable, appropriate, or necessary in a given installation. In this regard, highly conductive materials, such as aluminum or copper, for example, may be employed.

A wick structure 30 is disposed within the hollow interior 20 of the sealed enclosure 12, and includes a first, horizontal wick portion 32, with one or more second, vertical wick portions 34 protruding transversely from the horizontal wick portion. In this regard, it should be noted that the terms "horizontal" and "vertical" are used herein merely to refer to the orientations represented in the drawings. The cooling device of the present invention can also be employed in various other orientations, provided that the second or vertical wick portions are at least partially submerged in a thermally conductive liquid 28, as discussed below. Preferably, but not necessarily, the lower or free ends 35 of the wick portions 34 protrude into such thermally conductive liquid 28.

The enclosure 12 also includes a partition 40 extending through the generally hollow interior 20 of the enclosure 12 to at least partially divide the interior into a heat intake chamber 46 and a heat rejection chamber 48. The above-mentioned thermally conductive liquid 28 is introduced into the hollow interior 20 of the enclosure 12, after the enclosure has been evacuated, and at least partially fills the space between the vertical wick portions 34. Preferably, one or more partition openings 44 are provided in the partition 40 in order to allow condensed liquid 28 to drain from the heat intake chamber 46 to the heat rejection chamber 48, as will be explained in more detail below.

The wick structure 30 can be composed of a porous material, such as a porous, sintered, or powdered metal, or a ceramic material, for example, in order to draw the liquid 28 generally upward to the horizontal wick structure, primarily by way of capillary forces, but also by way of forces generated by the static head of the liquid 28, as well as other forces that will readily occur to one skilled in the art. The horizontal wick structure 30 also preferably includes at least one hollow recess 38 opening into the heat intake chamber, and can also include a second, smaller hollow recess 39, disposed within the hollow recess 38, in order to form a stepped, high-surface-area configuration.

Figure 2:
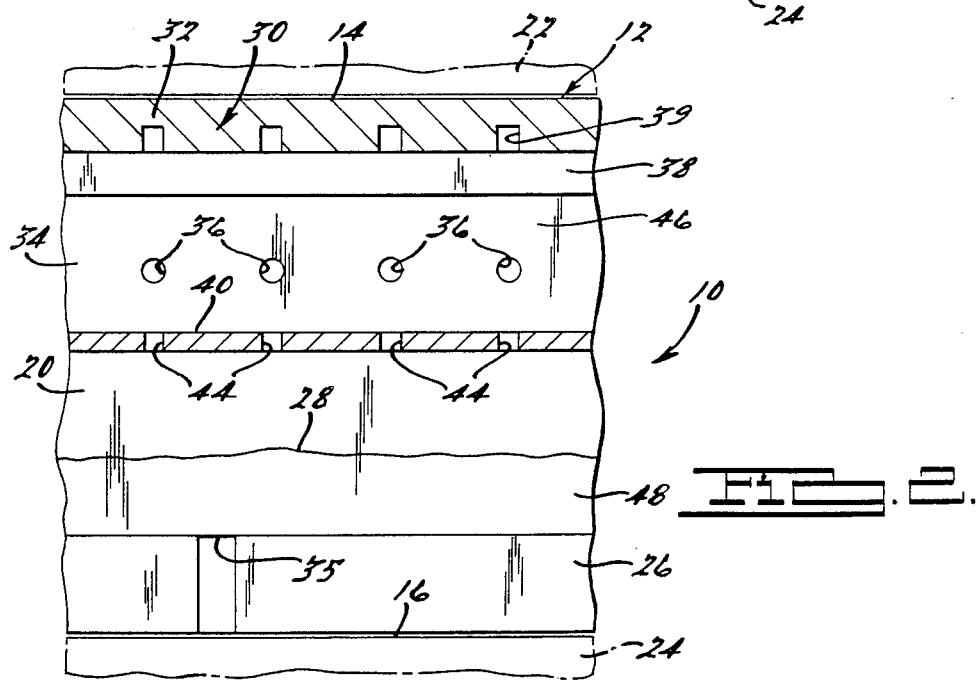
FIG. 2 is a cross-sectional view taken generally along line 2—2 of FIG. 1.

The temperature control device 10 illustrated in FIGS. 1 and 2 functions to control and regulate the temperature of the temperature-controlled item 22 by way of the liquid 28 being transported through the vertical wick portions 34 into the horizontal wick portions 32, in which the liquid 28 is evaporated. Such evaporization occurs due to the proximity of the horizontal wick portion 32 with the first thermally conductive wall 14, which is greater than the boiling temperatures of the liquid.

As a result of the resistance to the flow of the evaporated liquid through the wick portions 32 and 34 being greater than the resistance to such flow through the hollow recessed portions 38 and 39, the vapor flows through these recessed passages and thus does not interfere with the upward capillary flow of the liquid 28. The vapor flowing between the vertical wick portions 34, by way of the holes or recesses 38 and 39 then condenses on the surfaces defined by the side walls 18, the partition 40, and the liquid 28. In this regard, it should be noted that the partition 40 preferably has end portions 42 that are spaced away from the side walls 18, in order to facilitate the fluid communication for the vapor or condensed liquid between the heat intake chamber 46 and the heat rejection chamber 48.

In this regard, the vertical wicks 34 preferably include generally horizontal wick openings 36 extending laterally therethrough in order to provide fluid communication among the various spaces between adjacent wick portions 34, thus tending to equalize the vapor pressure in the heat intake chamber 46. Also, the partition 40 preferably includes the above-mentioned partition openings 44, which allow condensed liquid 28 to drain from the heat intake chamber 46 to the heat rejection chamber 48.

The temperature control device 10 is especially advantageously employed in applications for cooling and controlling the temperatures of automotive electronic components. In such an application, when the vehicle engine is running, the temperature control device 10 is rather intensely vibrated, resulting in a desirable mixing of the various layers of the liquid 28. Such mixing aids in the transfer of heat from the upper surface of the liquid to the second thermally conductive wall 16, as well as providing for a more uniform temperature in the cooling liquid 28, and enhancing the convective heat transfer from the liquid 28 to the bottom or second thermally conductive wall 16 and the heat sink 24 (if employed).

Another advantage of the cooling device of the present invention, as compared to prior devices, such as heat pipes, lies in the relatively short distance between the upper and lower thermally conductive walls in the direction of flow of the cooling liquid in the wick structures. In addition, the flow of vapor as it condenses is not a counter flow that would otherwise interfere with such liquid flow through the wick structure, and such liquid flow is aided by the static pressure of the cooling liquid.

It should be noted that the rectangular geometry of the temperature control devices depicted in the drawings is merely exemplary, and the device can be sized and shaped so as to match the size and shape of the item to be cooled, the heat sink (if any), or other space constraints. Preferably, however, the geometry, size, and materials employed in the temperature control device 10 should be sized by one skilled in the art such that the vapor adjacent the first thermally conductive wall 14 is at the boiling temperature of the cooling liquid 28, but not greater. In this regard, it is also preferred that the cooling liquid in the heat rejection chamber 48 is present in a sufficient quantity to provide for a heat accumulation effect, which is discussed in more detail below, and which results in smoother transitions in response to varying operating conditions in a given application. It should also be emphasized that the partition 40 in the temperature control device 10 can optionally be eliminated, but is preferably provided in order to increase the pressure differential between the heat intake chamber 46 and the heat rejection chamber 48. In this regard, the free end of the second wick portion 34 can be spaced from the second thermally conductive wall 16, as shown in the drawings discussed below, or it can physically contact the second thermally conductive wall 16. In such an instance, however, additional wick openings (not shown) should be provided at a position below the partition 40 in order to allow for the intermixing of the liquid 28 to attain a relatively uniform temperature distribution in the liquid 28, as discussed below.

FIGS. 3 and 4 illustrate another embodiment of the present invention, wherein the temperature control device 110 is generally similar in many respects to the temperature control device 10 discussed above and illustrated in FIGS. 1 and 2, but with certain exceptions discussed below. Because of the similarity between these two embodiments of the present invention, similar or corresponding elements of the temperature control device 110 are indicated by reference numerals in FIGS. 3 and 4 that are similar to those of the temperature control device 10 in FIGS. 1 and 2, but which have a one-hundred prefix.

In the temperature control device 110 of FIGS. 3 and 4, the single horizontal partition 40, with its partition openings 44 illustrated in FIGS. 1 and 2, is replaced by space-apart partitions 140 and 141, which are sealingly interconnected by side partitions 145 in order to form a sealed enclosure 150. In this regard, in order to maintain such a sealed condition, additional side partitions 147 adjacent the porous vertical sides of the vertical wick portions 34 are also sealingly interconnected with the partitions 140 and 141.

The partitions 140 and 141, as well as the side partitions 145 and 147 define one or more intermediate chambers 150 between the heat intake chamber 146 and the heat rejection chamber 148. The interior of the intermediate chamber 150 can be evacuated, filled with air, or filled with an intermediate thermally conductive cooling liquid, which should have an evaporation temperature higher than the maximum operating temperature of the temperature control device 110. In this way, the liquid in the intermediate chamber 150 remains in the liquid phase during normal operation of the device, but provides for significantly increased heat accumulation that is advantageous for stabilizing the temperature of the primary cooling liquid 128, within a predetermined temperature range.

Because of the configuration of the intermediate chamber 150 in FIGS. 3 and 4, the partition holes 44 of the temperature control device 10 in FIGS. 1 and 2 are eliminated. The upper partition 140, however, is preferably sloped in a generally downward direction toward the side walls 118 in order to cause the condensed vapor to flow through the wick openings 136 toward the side walls 18 where such condensed liquid can flow through the space between the side walls 18 and the end portions 142. It should be noted that the level of this condensation on the upper partition 140 is typically up to the wick openings 136, which results in a layer of cooling liquid remaining on the sloped surface of the partition 140. This layer of cooling liquid, however, is advantageous in aiding in the condensation of the vapor in the heat intake chamber 146.

These features, along with the significantly enhanced heat accumulation capability of the alternate embodiment illustrated in FIGS. 3 and 4, results in the temperature control device 110 of FIGS. 3 and 4 being particularly advantageous in applications where there is little vibration to cause liquid mixing and the resultant temperature uniformity throughout the cooling liquid 28 in the heat rejection chamber 48 of the temperature control device 10 illustrated in FIGS. 1 and 2. Thus, like the temperature control device 10 of FIGS. 1 and 2, the temperature control device 110 of FIGS. 3 and 4 not only serves as a cooling device, but also as a temperature stabilization device due to the heat accumulation capability provided by the quantity of cooling liquid 28 (or 128) in the heat rejection chamber 48 (or 148). This effect is also due to a constant liquid evaporation temperature, and the device's capability of absorbing varying amounts of heat generated by the equipment or item to be cooled. This is especially important in applications wherein electronic components are to be cooled, since a stable temperature environment is extremely important to the proper functioning of such equipment.

Figure 5:
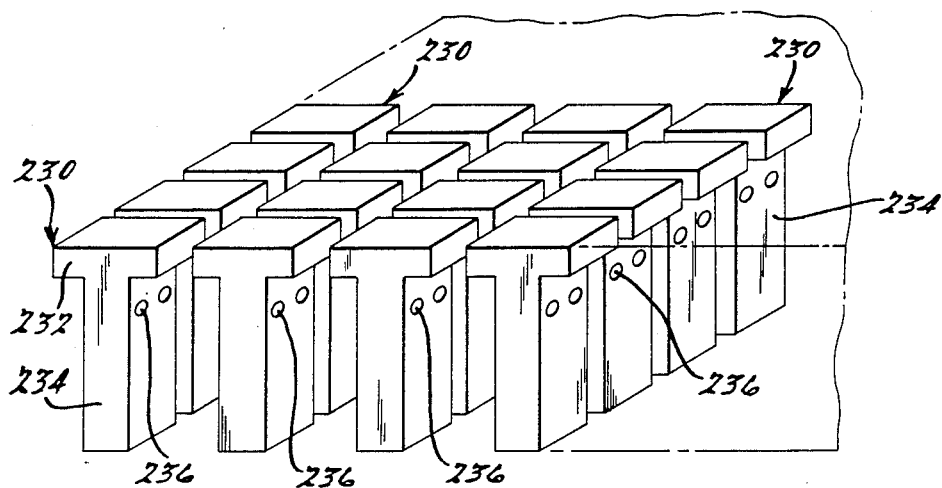
FIG. 5 is a diagrammatic illustration of an alternate wick configuration, wherein individual modularized wick components are disposed in an array within the two-phase cooling device in order to allow the device to be tailored to specific requirements.
Figure 6:
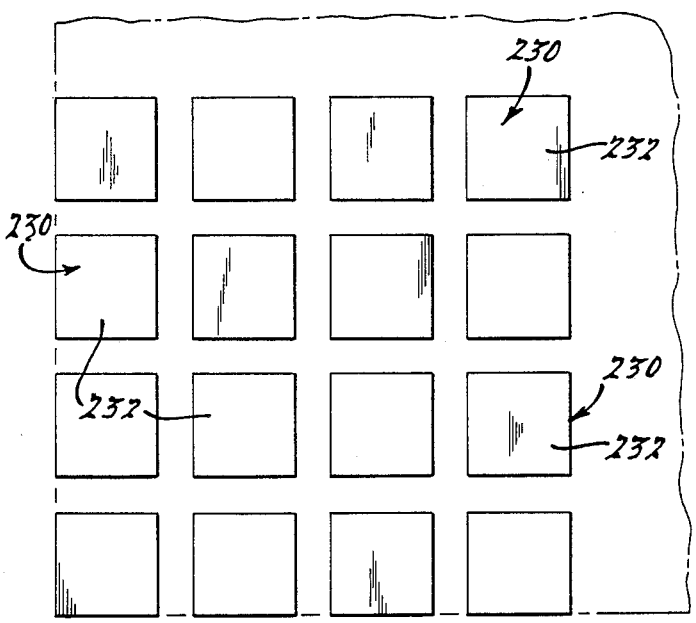
FIG. 6 is a top view of the modularized wick element array of FIG. 5.

FIGS. 5 and 6 illustrate still another variation on the present invention, wherein the wick structure is usable in any of the embodiments previously discussed. The wick structure in FIGS. 5 and 6 is generally similar to the wick structure 30 and 130 discussed above, except that it is made up of a number of modularized wick structure components 230, each having a horizontal wick portion 232 and a vertical wick portion 234, with wick openings 236 extending therethrough. The individual modularized components 230 can be arranged in virtually any desired geometrical array suitable for the given application, using as many of the individual modularized components as are required for the operating parameters involved in the given application. In such an application, the spaces 252 between the individual wick components 230 serve to provide the same decreased resistance to the flow of vapor as is provided by the hollow recesses 39 and 38 in the temperature control device 110, or by the hollow recesses 138 and 139 of the temperature control device 110. The provision of the wick structure in modularized individual wick components 230, however, greatly increases the economy of manufacture and the flexibility of application for a wide variety of temperature control and cooling situations.

Optionally, the vertical wick portions 234 can be generally rounded or cylindrical, or can be formed in other suitable shapes, in lieu of the rectangular cross-sectional shape shown for purposes of illustration in the drawings. In such optional constructions, the wick openings 236 may not be necessary if the particular geometry results in spaces between the vertical wick portions in order to allow for the above-discussed mixing of the cooling liquid in the heat rejection chamber.

The foregoing discussion discloses and describes exemplary embodiments of the present invention. One skilled in the art will readily recognize from such discussion, and from the accompanying drawings and claims, that various changes, modifications and variations can be made therein without departing from the spirit and scope of the invention as defined in the following claims.

I claim:

1. A two-phase cooling device for transferring heat from an item to be cooled, said cooling device comprising:

a sealed enclosure having a generally hollow interior defined at least in part by first and second thermally conductive walls spaced apart from one another and by side walls interconnecting said first and second thermally conductive walls, said first thermally conductive wall being adapted for interconnection with the item to be cooled in a thermally conductive relationship therewith;

at least one partition extending through said interior of said enclosure to at least partially divide said interior into a heat intake chamber and a heat rejection chamber, said partition having at least one partition opening extending therethrough for providing fluid communication between said heat intake and rejection chamber;

a wick structure disposed within said interior of said enclosure, said wick structure having a first wick portion disposed within said heat intake chamber and extending along at least a portion of said first thermally conductive wall in direct contact therewith for thermal conductivity therebetween, and a second wick portion protruding transversely from said wick portion, said second wick portion extending through both said heat intake chamber and said partition and extending into said heat rejection chamber, said second wick portion having a free end disposed in said heat rejection chamber;

said first wick portion having a generally hollow recess in an opposite side thereof from said first thermally conductive wall, said hollow recess opening into said heat intake chamber;

said second wick portion further being spaced apart from said side walls and having a wick opening extending therethrough at a location between said first wick portion and said partition for providing fluid communication between opposite sides of said second wick portion within said heat intake chamber; and a thermally conductive liquid disposed within said heat rejection chamber at a liquid level above said free end of said second wick portion, said liquid being capable of being transported through said second wick portion and into said first wick portion wherein said liquid is evaporated by heat from the item to be cooled and condensed on the surfaces defined by said hollow recess in said first wick portion and by said partition and on the surface of said liquid.

2. A cooling device according to claim 1, further including a plurality of said second wick portions spaced apart from one another and protruding transversely from said first wick portion, said thermally conductive liquid being disposed within said heat rejection chamber at a liquid level above said free ends of at least some of said second wick portions, and said first wick portion having at least one of said generally hollow recesses disposed between each adjacent spaced-apart pair of said second wick portions.

3. A cooling device according to claim 2, wherein said partition includes an opening between each adjacent spaced-apart pair of said second wick portions for said fluid communication between said heat intake and rejection chambers.

4. A cooling device according to claim 1, wherein said generally hollow recess in said first wick portion includes at least a second generally hollow recess therein in order to define a stepped recess configuration.

5. A cooling device according to claim 1, wherein said second thermally conductive wall includes at least one heat transfer fin protruding therefrom into said heat rejection chamber.

6. A cooling device according to claim 1, wherein said second thermally conductive wall is adapted for interconnection with a heat sink in a thermally conductive relationship therewith, said heat sink being at a temperature lower than that of said item to be cooled.

7. A cooling device according to claim 1, wherein said first wick portion is composed of a different material than that of said second wick portion.

8. A cooling device according to claim 7, wherein the material of said first wick portion has a lower thermal conductivity than that of the material of said second wick portion.

9. A cooling device according to claim 1, wherein at least a portion of said partition is spaced apart from at least one of said side walls in order to provide for said fluid communication between said heat intake and rejection chambers.

10. A cooling device according to claim 1, wherein the resistance to the flow of said evaporated liquid through said fist wick portion is greater than the resistance to the flow of said evaporated liquid through said hollow recess.

11. A cooling device according to claim 1, further including a second partition at least partially spaced apart from said first partition and sealingly interconnected therewith to define a sealed intermediate chamber between said heat intake and rejection chambers, said first and second partitions and said intermediate chamber being spaced away from at least one of said side walls in order to define said opening for providing said fluid communication between said heat intake and rejection chambers.

12. A cooling device according to claim 11, further including a second thermally conductive liquid therein, said second thermally conductive liquid having an evaporation temperature higher than that of said first thermally conductive liquid, said second thermally conductive liquid tending to stabilize the temperature of said first thermally conductive liquid within a predetermined temperature range during operation of said cooling device.

13. A cooling device according to claim 12, wherein said second partition is disposed between said first wick portion and said first partition, said second partition having at least a portion thereof sloped in a generally downward direction generally toward at least one of said side walls.

14. A cooling device according to claim 13, wherein said wick opening in said second wick portion is disposed between said first wick portion and said second partition.

15. A two-phase cooling device for transferring heat from an item to be cooled, said cooling device comprising:

a sealed enclosure having a generally hollow interior defined at least in part by first and second thermally conductive walls spaced apart from one another and by side walls interconnecting said first and second thermally conductive walls, said first thermally conductive wall being adapted for interconnection with the item to be cooled in a thermally conductive relationship therewith;

a wick structure disposed within said interior of said enclosure, said hollow interior and extending along at least a portion of said first thermally conductive wall in direct contact therewith for thermal conductivity therebetween, and a second wick portion protruding transversely from said wick portion, and extending through a substantial portion of said hollow interior, said second wick portion having a free end disposed generally adjacent said second thermally conductive wall;

said first wick portion having a generally hollow recess in an opposite side thereof from said first thermally conductive wall, said hollow recess opening into said hollow interior; and a thermally conductive liquid disposed within said hollow interior at a level above said free end of said second wick portion, said liquid being capable of being transported through said second wick portion and into said first wick portion wherein said liquid is evaporated by heat from the item to be cooled and condensed on the surfaces defined by said hollow recess in first wick portion and on the surface of said liquid.

16. A cooling device according to claim 15, wherein said cooling device further includes at least one partition extending through said interior of said enclosure to at least partially divide said interior into a heat intake chamber and a heat rejection chamber, said partition having at least one partition opening extending therethrough for providing fluid communication said heat intake and rejection chamber.

17. A cooling device according to claim 15, wherein said generally hollow recess in said first wick portion includes at least a second generally hollow recess therein in order to define a stepped recess configuration.

18. A cooling device according to claim 15, wherein said second wick portion is further spaced apart from said side walls and has a wick opening extending therethrough at a location between said first wick portion and said partition for providing fluid communication between opposite sides of said second wick portion within said heat intake chamber.

19. A cooling device according to claim 15, further including a plurality of said second wick portions spaced apart from one another and protruding transversely from said first wick portion, said thermally conductive liquid being disposed within said hollow interior at a liquid level above said free ends of at least some of said second wick portions, and said first wick portion having at least one of said generally hollow recesses disposed between each adjacent spaced-apart pair of said second wick portions.

20. A cooling device according to claim 15, wherein said second thermally conductive wall includes at least one heat transfer fin protruding therefrom into said heat rejection chamber.

21. A cooling device according to claim 15, wherein said second thermally conductive wall is adapted for interconnection with a heat sink in a thermally conductive relationship therewith, said heat sink being at a temperature lower than that of said item to be cooled.

22. A cooling device according to claim 15, wherein said first wick portion is composed of a different material than that of said second wick portion.

23. A cooling device according to claim 22, wherein the material of said first wick portion has a lower thermal conductivity than that of the material of said second wick portion.

24. A cooling device according to claim 15, wherein both of said wick portions are composed of a porous metallic material.

25. A cooling device according to claim 16, further including a second partition at least partially spaced apart from said first partition and sealingly interconnected therewith to define a sealed intermediate chamber between said heat intake and rejection chambers, said first and second partitions and said intermediate chamber being spaced away from at least one of said side walls in order to define said opening for providing said fluid communication between said heat intake and rejection chambers.

26. A cooling device according to claim 25, further including a second thermally conductive liquid therein, said second thermally conductive liquid having an evaporation temperature higher than that of said first thermally conductive liquid, said second thermally conductive liquid tending to stabilize the temperature of said first thermally conductive liquid within a predetermined range during operation of said cooling device.

27. A cooling device according to claim 26, wherein said second partition is disposed between said first wick portion and said first partition, said second partition having at least a portion there of sloped in a generally downward direction generally toward at least one of said side walls.

28. A two-phase cooling device for transferring heat from an item to be cooled, said cooling device comprising:

a sealed enclosure having a generally hollow interior defined at least in part by first and second thermally conductive walls spaced apart from one another and by side walls interconnecting said first and second thermally conductive walls, said first thermally conductive wall being adapted for interconnection with the item to be cooled in a thermally conductive relationship therewith;

at least one partition extending through said interior of said enclosure to at least partially divide said interior into a heat intake chamber and a heat rejection chamber, at least a portion of said partition is spaced apart from at least one of said side walls in order to provide for fluid communication between said heat intake and rejection chambers, said partition having at least one partition opening extending therethrough for providing additional fluid communication between said heat intake and rejection chamber;

a wick structure disposed within said interior of said enclosure, said wick structure having a first wick portion disposed within said heat intake chamber and extending along at least a portion of said first thermally conductive wall in direct contact therewith for thermal conductivity therebetween, and a plurality of second wick portions protruding transversely from said wick portion, said second wick portions extending through both said heat intake chamber and said partition and extending into said heat rejection chamber, said second wick portions having a free end disposed generally adjacent said second thermally conductive wall in said heat rejection chamber;

said first wick portion having a number of generally hollow recesses in an opposite side thereof from said first thermally conductive wall, at least one of said generally hollow recesses being disposed between each adjacent spaced-apart pair of said second wick portions, said hollow recess opening into said heat intake chamber and having a second hollow recess therein in order to define a stepped recess configuration;

said partition having one of said partition openings between each of said adjacent space-apart pair of said second wick portions;

said second wick portions further being spaced apart from said side walls and each having a wick opening extending therethrough at a location between said first wick portion and said partition for providing fluid communication between opposite sides of each of said second wick portions within said heat intake chamber; and a thermally conductive liquid disposed within said heat rejection chamber at a level above said free ends of said second wick portions, said liquid being capable of being transported through said second wick portions and into said first wick portion wherein said liquid is evaporated by heat from the item to be cooled and condensed on the surfaces defined by said hollow recesses in first wick portion and by said partition and on the surface of said liquid, the resistance to the flow of said evaporated liquid through said first wick portion being greater than the resistance to the flow of said evaporated liquid through said hollow recess.

29. A cooling device according to claim 28, wherein said second thermally conductive wall includes at least one heat transfer fin protruding therefrom into said heat rejection chamber.

30. A cooling device to claim 29, wherein said second thermally conductive wall is adapted for interconnection with a heat sink in a thermally conductive relationship therewith, said heat sink being at a temperature lower than that of said item to be cooled.

31. A cooling device according to claim 30, wherein said first wick portion is composed of a different material than that of said second wick portion.

32. A cooling device according to claim 31, wherein the material of said first wick portion has a lower thermal conductivity than that of the material of said wick portion.

33. A cooling device according to claim 1, further including a second partition at least partially spaced apart from said first partition and sealingly interconnected therewith to define a sealed intermediate chamber between said heat intake and rejection chambers, and first and second partitions and said intermediate chamber being spaced away from at least one of said side walls in order to define said opening for providing said fluid communication between said heat intake and rejection chambers.

34. A cooling device according to claim 33, further including a second thermally conductive liquid therein, said second thermally conductive liquid having an evaporation temperature higher than that of said first thermally conductive liquid, said second thermally conductive liquid tending to stabilize the temperature of said first thermally conductive liquid within a predetermined temperature range during operation of said cooling device.

35. A cooling device according to claim 12, wherein said second partition is disposed between said first wick portion and said first partition, said second partition having at least a portion thereof sloped in a generally downward direction generally toward at least one of said side walls.

36. A cooling device according to claim 13, wherein said wick openings in said second wick portions is disposed between said first wick portion and said second partition.

* * * * *

UNITED STATES PATENT AND TRADEMARK OFFICE
CERTIFICATE OF CORRECTION

PATENT NO. : 4,880,053

DATED : November 14, 1989

INVENTOR(S) : Vladimir Sheyman

It is certified that error appears in the above-indentified patent and that said Letters Patent is hereby corrected as shown below:

On the title page, [75]
At inventor name, delete "Sheyman: Vladimir" and insert ---- Sheyman ----.

At [75], delete "Sheyman: Vladimir" and insert ---- Sheyman, Vladimir ----.

Column 1, line 13, begin a new paragraph after "cooled."

Column 1, line 28, delete "which" (second occurrence).

Column 2, line 63, after "thermally" insert ---- conductive ----.

Column 9, line 2, after "enclosure," insert ---- said wick structure having a first wick portion disposed within ----.

Column 9, line 6, after "said" insert ---- first ----.

Column 9, line 30, after "communication" insert ---- between ----.

Column 10, line 21, after "mined" insert ---- temperature ----.

Column 10, line 25, delete "there of" and insert ---- thereof ----.

Column 11, line 6, delete "space-apart" and insert ---- spaced-apart ----.

Column 11, line 33, after "device" insert ---- according ----.

Column 12, line 6, after "said" insert ---- second ----.

Column 12, line 8, delete "1" and insert --- 28 ----.

UNITED STATES PATENT AND TRADEMARK OFFICE
CERTIFICATE OF CORRECTION

PATENT NO. : 4,880,053

DATED : November 14, 1989

INVENTOR(S) : Vladimir Sheyman

It is certified that error appears in the above-indentified patent and that said Letters Patent is hereby corrected as shown below:

Column 12, line 13, delete "and" (first occurrence) and insert ---- said ----.

Column 12, line 27, delete "12" and insert ---- 34 ----.

Column 12, line 33, delete "13" and insert ---- 35 ----.

Signed and Sealed this

Sixth Day of December, 1994

Attest:

BRUCE LEHMAN

Attesting Officer     *Commissioner of Patents and Trademarks*